(12) United States Patent
Kim et al.

(10) Patent No.: US 12,712,469 B2
(45) **Date of Patent: *Aug. 18, 2026**

(54) POWER CONVERTER MODULE

(71) Applicant: TEXAS INSTRUMENTS INCORPORATED, Dallas, TX (US)

(72) Inventors: Woochan Kim, San Jose, CA (US); Vivek Kishorechand Arora, San Jose, CA (US); Makoto Shibuya, Beppu (JP); Kengo Aoya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 540 days.

This patent is subject to a terminal disclaimer.

(21) Appl. No.: 18/169,113

(22) Filed: Feb. 14, 2023

(65) Prior Publication Data

US 2023/0198422 A1 Jun. 22, 2023

Related U.S. Application Data

(63) Continuation of application No. 17/461,423, filed on Aug. 30, 2021.

(51) Int. Cl.
*H02M 7/527* (2006.01)
*H02M 3/00* (2006.01)
(Continued)

(52) U.S. Cl.
CPC .......... *H02M 7/527* (2013.01); *H02M 3/003* (2021.05); *H02M 3/1582* (2013.01);
(Continued)

(58) Field of Classification Search
CPC .... H02M 7/527; H02M 3/003; H02M 3/1582; H02M 7/003; H02M 1/088; H02M 1/44;
(Continued)

(56) References Cited

U.S. PATENT DOCUMENTS 5,444,297 A 8/1995 Oshima et al.
9,450,491 B2 9/2016 Zhang et al.
(Continued)

OTHER PUBLICATIONS

German Office Action mailed Mar. 14, 2025, German Patent Application No. 102022120776.5, 6 pages.
(Continued)

*Primary Examiner* — S M Sohel Imtiaz
(74) *Attorney, Agent, or Firm* — Ronald O. Neerings; Frank D. Cimino

(57) ABSTRACT

A power converter module includes power transistors and a substrate having a first surface and a second surface that opposes the first surface. A thermal pad is situated on the second surface of the substrate, and the thermal pad is configured to be thermally coupled to a heat sink. The power converter module also includes a control module mounted on a first surface of the substrate. The control module also includes control IC chips coupled to the power transistors. A first control IC chip controls a first switching level of the power converter module and a second control IC chip controls a second switching level of the power converter module. Shielding planes overlay the substrate. A first shielding plane is situated between the thermal pad and the first control IC chip and a second shielding plane is situated between the thermal pad and a second control IC chip.

21 Claims, 14 Drawing Sheets

(51) Int. Cl.

| | |
|---|---|
| ***H02M 3/158*** | (2006.01) |
| ***H02M 7/00*** | (2006.01) |
| ***H10D 62/832*** | (2025.01) |
| ***H10D 62/85*** | (2025.01) |

(52) U.S. Cl.
CPC ........ *H02M 7/003* (2013.01); *H10D 62/8325* (2025.01); *H10D 62/8503* (2025.01)

(58) Field of Classification Search
CPC .............. H02M 3/158; H10D 62/8325; H10D 62/8503; H01L 23/552; H01L 25/072
See application file for complete search history.

(56) References Cited

U.S. PATENT DOCUMENTS

| | | | |
|---|---|---|---|
| 9,793,804 | B2 | 10/2017 | Zhang et al. |
| 10,811,975 | B1 | 10/2020 | Bala et al. |
| 2005/0167849 | A1 | 8/2005 | Sato |
| 2007/0108582 | A1* | 5/2007 | Karnezos .............. H01L 23/552 257/E25.013 |
| 2012/0242299 | A1 | 9/2012 | Xu et al. |
| 2018/0096951 | A1 | 4/2018 | Chen |
| 2019/0353686 | A1* | 11/2019 | Fushimi ................. H02K 5/203 |
| 2020/0075541 | A1 | 3/2020 | Sturcken |
| 2020/0120789 | A1* | 4/2020 | Ishikawa ............... B60L 15/007 |
| 2022/0045612 | A1* | 2/2022 | Clavette .............. H02M 3/1584 |
| 2022/0102251 | A1 | 3/2022 | Kinzer |
| 2022/0278080 | A1* | 9/2022 | Matsumoto ............... H03F 1/56 |

OTHER PUBLICATIONS

Costa, et al.: “Multilevel Buck DC-DC Converter for High Voltage Application”; (2012) Proc. 10th IEEE/IAS Induscon. 1-8. 10.1109/INDUSCON.2012.6453673.

* cited by examiner

POWER CONVERTER MODULE

CROSS-REFERENCE TO RELATED APPLICATIONS

This application is a continuation of co-pending application Ser. No. 17/461,423 filed Aug. 30, 2021, the contents of which are incorporated herein by reference in its entirety.

TECHNICAL FIELD

This disclosure relates to power converter modules.

BACKGROUND

In electrical engineering, power conversion is the process of converting electric energy from one form to another. A power converter module is an electrical device that includes a power converter that can convert electrical energy. Some power converters convert direct current (DC) into alternating current (AC). Such power converters are sometimes referred to as a DC-to-AC power converter, or more simply as a power inverter. Some power converters convert AC into DC, such power converters are referred to as AC-to-DC power converters. Still other power converters, namely a DC-to-DC power converter converts a source of DC from one voltage level to another voltage level.

Gallium Nitride (GaN) has a relatively high electron mobility and saturation velocity that enables the employment of GaN for high-power and high-temperature microwave applications. High-power/high-frequency devices based on GaN include microwave radio-frequency power amplifiers (such as those used in high-speed wireless data transmission) and high-voltage switching devices for power grids. More particularly, GaN is employable to fabricate GaN field effect transistors (FETs). As compared with a metal-oxide semiconductor field effect transistor (MOSFET), the GaN FET has a lower drain to source resistance when the GaN FET is on ($R_{DS(ON)}$). Also, a GaN FET has lower input capacitance than a MOSFET, such that the GaN FET has a faster on/off switching rate.

SUMMARY

A first example relates to a power converter module. The power converter module includes power transistors and a substrate having a first surface and a second surface that opposes the first surface. A thermal pad is situated on the second surface of the substrate, and the thermal pad is configured to be thermally coupled to a heat sink. The power converter module also includes a control module mounted on the first surface of the substrate. The control module includes an interconnect configured to provide a connection to a system bus. The control module also includes control IC chips coupled to the power transistors. A first control IC chip of the control IC chips controls a first switching level of the power converter module and a second control IC chip of the control IC chips controls a second switching level of the power converter module. The power converter module further comprises shielding planes overlaying the first surface of the substrate. The shielding planes provide a first shielding plane situated between the thermal pad and the first control IC chip of the IC chips and a second shielding plane of the shielding planes situated between the thermal pad and a second control IC chip of the control IC chips.

A second example relates to a method for fabricating a power converter module. The method includes patterning a direct bonded copper (DBC) layer on a first surface of a substrate with a region for a control module, wherein the substrate has a thermal pad on a second surface of the substrate that opposes the first surface of the substrate for thermally coupling the power converter module to a heat sink. The method also includes mounting power transistors on the substrate. The method further includes mounting control IC chips such that shielding planes are situated between the control IC chips and the thermal pad on the second surface of the substrate. Accordingly, a first shielding plane of the shielding planes underlies a first control IC chip of the control IC chips, and a second shielding plane of the shielding planes underlies a second control IC chip of the control IC chips.

DETAILED DESCRIPTION

This description relates to a power converter module that includes selective shielding for control integrated circuit (IC) chips. The power converter module is a multilevel switching power converter, such as a DC-to-DC converter or a DC-to-AC converter. The power converter module is fabricated with control IC chips that control power transistors to output high power. In various examples, the power transistors are implemented as gallium nitride (GaN) field effect transistors (FETs), but in other examples, other type of transistors, such as gallium oxide (GaO) or silicon carbide (SiC) transistors are also employable. In such examples, each of the control IC chips provides a corresponding control signal to a control node (e.g., a gate or base) of a subset of the power transistors.

The power converter module is encased in a molding, such as plastic. A first side of the power converter module is mounted on a system bus for communication with an external system, and a thermal pad is situated on a second side of the power converter module. The thermal pad is mountable on the heat sink to enable thermal communication with a heat sink (e.g., a cold plate). Accordingly, heat generated by the power converter module is transferred to the heat sink and dissipated.

The power converter module includes a substrate that is formed with a ceramic core. A first surface of the substrate is patterned (e.g., with a direct bonded copper (DBC) layer) to receive a control module that includes the control IC chips mounted thereon. Shielding planes are situated to underlie the control IC chips, such that the shielding planes are situated between the control IC chips and the thermal pad. More specifically, the power converter module is configured such that there is one shielding plane of the shielding planes dedicated to each switching level of the power converter module. Accordingly, in an example where the power converter module has two switching levels, there are at least two shielding planes that are electrically isolated from each other. In such a situation, a first shielding plane underlies a first control IC chip for a first switching level of the power converter module, and a second shielding plane underlies a second control IC chip for the second switching level of the power converter module. Additionally, the shielding planes are large enough to underlie a trace (or multiple traces) of the control module. Inclusion of the shielding planes block electromagnetic interference (EMI) emanating from the heat sink to prevent interference on control signals output by the control IC chips, thereby enabling the power converter module to operate at high frequencies (e.g., such as frequencies of at least 200 kilohertz) and/or high slew rates (e.g., a slew rate of at least 100 volts per nanosecond).

Figure 1:
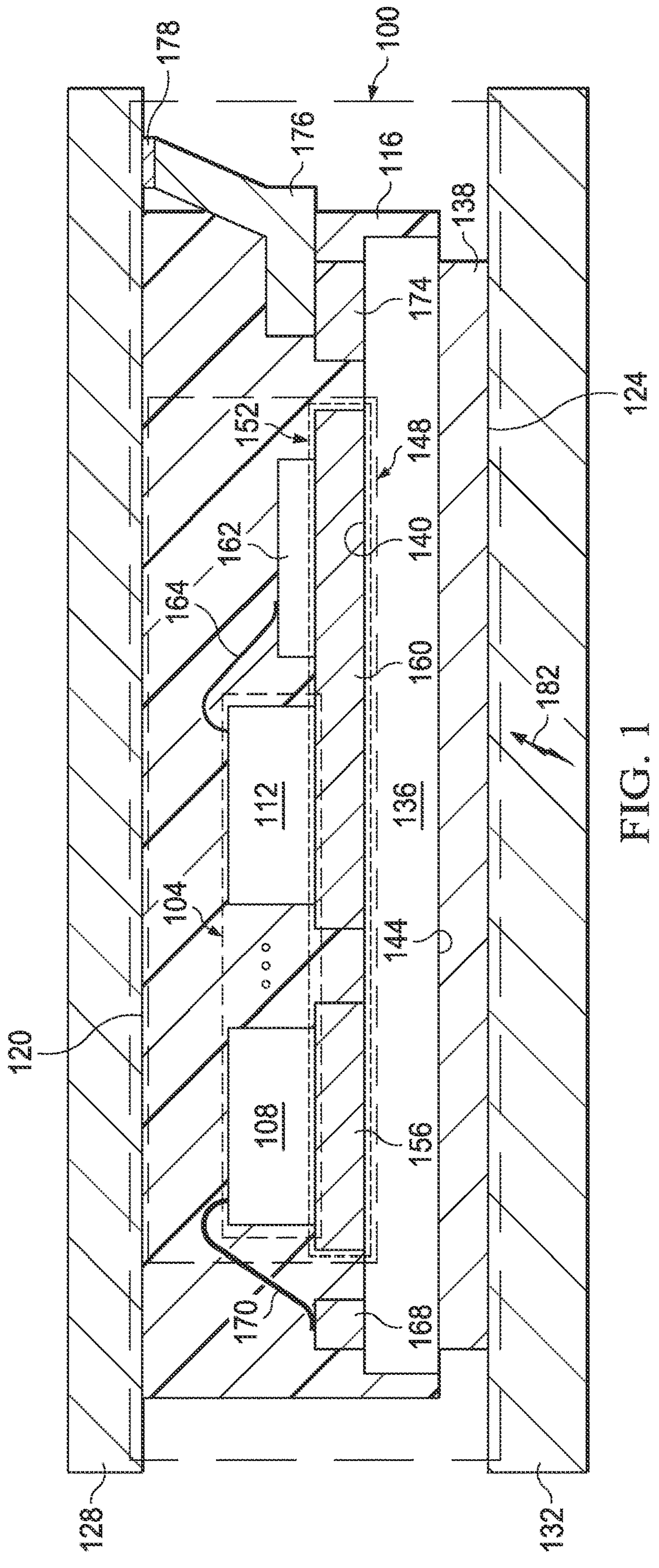
FIG. 1 illustrates a cross-section diagram of an example of a power converter module with shielding planes.

FIG. 1 illustrates a cross-section diagram of an example of a power converter module 100 formed with selective shielding for control integrated circuit (IC) chips. As one example, the power converter module 100 is a multilevel switching power converter. In some examples, the power converter module 100 is a multilevel DC-to-DC converter, such as a buck converter (a step-up converter) or a boost converter (a step-down converter). As another example, the power converter module 100 is a multilevel AC-to-DC converter, such as a half-bridge power converter or a full bridge power converter. In still other examples, the power converter module 100 is a multilevel DC-to-AC converter (e.g., an inverter). For the examples illustrated, it is presumed that the power converter module 100 is a DC-to-DC converter.

The power converter module 100 is fabricated with K number of control IC chips 104 that control power transistors to output high power, such as a range from about 100 volts (V) to about 700 V and a range of about 10 amperes (A) to about 150 A, where K is an integer greater than or equal to two. In the example illustrated, there is a first control IC chip 108 and a Kth control IC chip 112, but in other examples there are more than two (2) control IC chips. In various examples, the power transistors are implemented as gallium nitride (GaN) field effect transistors (FETs), but in other examples, other type of transistors, such as gallium oxide (GaO) or silicon carbide (SiC) transistors are also employable. In such examples, each of the K number of control IC chips 104 provides a corresponding control signal to a control node (e.g., a gate or base) of a subset of the power transistors.

The power converter module 100 is encased in a molding 116, such as plastic. The power converter module 100 includes a first side 120 and a second side 124, wherein the first side 120 and the second side 124 are opposing sides. In the example illustrated, the first side 120 of the power converter module 100 is mounted on a system bus 128. In some examples, the system bus 128 is a communication bus for an external system, such as a communication bus of an automotive system. The second side 124 of the power converter module 100 is mounted to be in thermal communication with a heat sink 132, which is alternatively referred to as a cold plate. Accordingly, heat generated by the power converter module 100 is transferred to the heat sink 132 and dissipated.

The power converter module 100 includes a substrate 136 that is formed with a ceramic core. The substrate 136 includes a first surface 140 and a second surface 144, wherein the first surface 140 opposes the second surface 144. The first surface 140 of the substrate 136 is patterned (e.g., with a direct bonded copper (DBC)) to receive a control module 148 that includes the K number of control IC chips 104 mounted thereon. K number (or more) shielding planes 152 underlie the K number of control IC chips 104, and the shielding planes 152 are electrically isolated from each other. In the example illustrated, there is a first shielding plane 156 and a Kth shielding plane 160. A thermal pad 138 (e.g., formed of a DBC layer) is applied to the second surface 144 of the substrate 136 to thermally couple the power converter module 100 to the heat sink 132.

In various examples, the K number of shielding planes 152 are implemented in different ways. In some examples, the K number of shielding planes 152 are integrated with a laminate substrate that includes a patterned ground plane on one surface and the shielding planes 152 on another surface. In other examples, the shielding planes 152 are integrated with a DBC layer applied to the substrate 136, and portions of an interconnect are mounted on the shielding planes 152.

Each of the K number of control IC chips 104 overlies a corresponding shielding plane 152. Accordingly, the first control IC chip 108 overlies the first shielding plane 156 and the Kth control IC chip 112 overlies the Kth shielding plane 160. The control IC chips 104 are mounted such that the K number of shielding planes 152 are situated between the heat sink 132 and the K number of control IC chips 104. Additionally, the control module 148 includes a trace 162 (e.g., a protected trace) that is electrically coupled to the Kth control IC chip 112 through a wire bond 164. In some examples, the trace 162 is employed to coupled the Kth control IC chip 112 to a corresponding set of power transistors. In the example illustrated, the trace 162 is situated to overlay the Kth shielding plane 160.

The first control IC chip 108 is coupled to a first pad 168 that is formed on the first surface 140 of the substrate 136 through a wire bond 170. Additionally, a second pad 174 is formed on the first surface 140 of the substrate 136. The second pad 174 is coupled to a tilted pillar 176 of an interconnect, such as a lead frame. The tilted pillar 176 is coupled to a pad 178 of the interconnect, enabling the power converter module 100 to communicate on the system bus 128.

As noted, the power converter module 100 is a multilevel power converter. Each of the K number of control IC chips 104 is dedicated to a particular switching level to control the power transistors (or some subset thereof) for intervals of a particular switching level operations of power converter module 100. For instance, consider an example, where the power converter module 100 has two (2) switching levels, a high side and a low side, a first subset of the power transistors are high side transistors and a second subset are low side transistors. In this situation, there are two control IC chips 104, namely a high side control IC chip, such as the first control IC chip 108 and a low side control IC chip, such as the Kth control IC chip 112. Continuing with this example, in operation, the first control IC chip 108 asserts a high side control signal during a high side switching level and de-asserts the high side control signal during the low side switching level. Assertion of the high side control signal turns on the first subset of power transistors (the high side transistors), causing the first subset of power transistors to operate in the linear region or saturation region. Similarly, de-assertion of the high side control signal turns off the first subset of power transistors, causing the first subset of power transistors to operate in the cutoff region. Additionally, in this example, the Kth control IC chip 112 asserts a low side control signal during a low side switching level and de-asserts the low side control signal during the high side switching level. Assertion of the low side control signal turns on the second subset of the power transistors (the low side transistors), causing the second subset of power transistors to operate in the linear region or saturation region. Similarly, de-assertion of the low side control signal turns off the second subset of power transistors, causing the second subset of power transistors to operate in the cutoff region.

Continuing with this example, the first control IC chip 108 and the Kth control IC chip 112 are configured such that the high side control signal and the low side control signals are complementary signals. Accordingly, during operation the power converter module 100 is configured such that the first subset of power transistors or the second set of transistors are turned on, and there is not a time that both the first subset of power transistors and the second subset of power transistors are both turned on.

The K number of shielding planes 152 block electromagnetic interference (EMI) emanating from the heat sink 132 and toward the power converter module 100, such as EMI emanating in a direction indicated by an arrow 182. As one example, the EMI generated by an external device, such as a radio frequency (RF) receiver or transmitter that is also coupled to the heat sink 132. This blocking of the EMI curtails the impact of the EMI on the control signals provided from the control IC chips 104 to the corresponding subset of power transistors. Such EMI, if unblocked, may interfere with the control signals, which in turn, changes an output of the power transistors, thereby distorting an output of the power converter module 100. However, inclusion of the K number of shielding planes 152 curtails such interference, enabling proper operation of the power converter module 100.

More particularly, as noted, the power converter module 100 is a multilevel switching power converter. As a switching frequency increases to about 200 kilohertz (kHz) and above and/or a slew rate increases to a level of about 100 volts per nanosecond (V/ns) or above, the EMI is increased. Accordingly, inclusion of that at least K number of shielding planes 152 for the K number of control IC chips 104 curtails the EMI, thereby enabling the power converter module 100 to operate at higher frequencies and/or slew rates.

Figure 2:
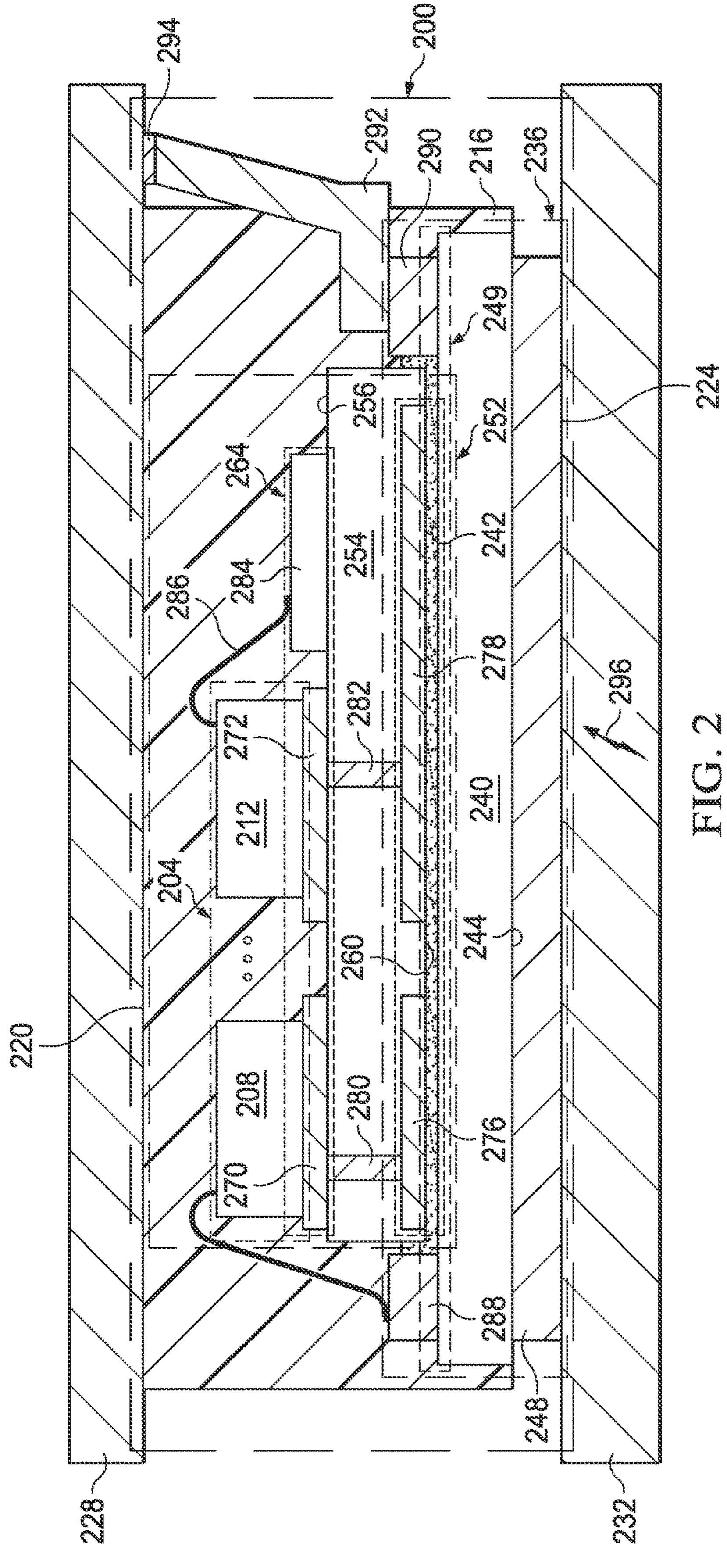
FIG. 2 illustrates a cross-section diagram of another example of a power converter module with shielding planes.

FIG. 2 illustrates a cross-section diagram of another example of a power converter module 200 formed with selective shielding for control IC chips. The power converter module 200 is employable to implement the power converter module 100 of FIG. 1. The power converter module 200 is a multilevel switching power converter. In one example, the power converter module 200 is a multilevel DC-to-DC converter, such as a buck converter (a step-up converter) or a boost converter (a step-down converter). As another example, the power converter module 200 is a multilevel AC-to-DC converter, such as a half-bridge power converter or a full bridge power converter. In still other examples, the power converter module 200 is a multilevel DC-to-AC converter (e.g., an inverter). For the examples illustrated, it is presumed that the power converter module 200 is a DC-to-DC converter.

The power converter module 200 is fabricated with K number of control IC chips 204 that control power transistors to output high power, such as a range from about 100 V to about 700 V and a range of about 20 A to about 250 A, where K is an integer greater than or equal to two. In the example illustrated, there is a first control IC chip 208 and a Kth control IC chip 212, but in other examples there are more than two (2) control IC chips. In various examples, the power transistors are implemented as GaN FETs, but in other examples, other types of transistors, such as GaO SiC transistors are also employable. In such examples, each of the K number of control IC chips 204 provides a corresponding control signal to a control node (e.g., a gate or base) of a subset of the power transistors.

The power converter module 200 is encased in a molding 216, such as plastic. The power converter module 200 includes a first side 220 and a second side 224, wherein the first side 220 and the second side 224 are opposing sides. In the example illustrated, the first side 220 of the power converter module 200 is mounted on a system bus 228. In some examples, the system bus 228 is a communication bus for an external system, such as a communication bus of an automotive system. The second side 224 of the power converter module 200 is mounted to be in thermal communication with a heat sink 232, which is alternatively referred to as a cold plate. Accordingly, heat generated by the power converter module 200 is transferred to the heat sink 232 and dissipated.

The power converter module 200 includes a substrate 236 that is formed with a ceramic core 240. The ceramic core 240 includes a first surface 242 and a second surface 244, wherein the first surface 242 opposes the second surface 244. A thermal pad 248 is patterned on the second surface 244 of the ceramic core 240. The thermal pad 248 is formed of a conductive material (e.g., copper) that is in thermal communication with the heat sink 232.

The first surface 242 of the ceramic core 240 is patterned with a patterned DBC layer 249 to enable mounting of a control module 252. The control module 252 includes a laminate substrate 254 (e.g., a printed circuit board) with a first surface 256 and a second surface 260, wherein the first surface 256 opposes the second surface 260. A patterned ground plane 264 is situated on the first surface 256 of the laminate substrate 254. Shielding planes 266 are patterned on the second surface 260 of the laminate substrate 254. Accordingly, the patterned ground plane 264 and the shielding planes 266 are spaced apart by the laminate substrate 254.

The patterned ground plane 264 incudes K number of pads, whereby each of the K number of control IC chips 204 is mounted on a respective pad. As illustrated, the first control IC chip 208 is mounted on a first pad 270 and the Kth control IC chip 212 is mounted on a Kth pad 272. The shielding planes 266 includes K number (or more) of shielding planes, such that each shielding plane is electrically isolated from other shielding planes and is designated for a corresponding control IC chip 204. As illustrated, a first shielding plane 276 underlies the first pad 270 and the first control IC chip 208 and a Kth shielding plane 278 underlies the Kth pad 272 and the Kth control IC chip 212. Further, vias extending through the laminate substrate 254 connect the patterned ground plane 264 with the shielding planes 266. More particularly, a first via 280 couples the first pad 270 with the first shielding plane 276, and a Kth via 282 couples the Kth pad 272 with the Kth shielding plane 278.

A trace 284 is coupled to the Kth control IC chip 212 through a wire bond 286. The trace 284 is formed on the patterned ground plane 264 of the laminate substrate 254. In some examples, the trace 284 is employed to coupled the Kth control IC chip 212 to a corresponding set of power transistors. The trace 284 is a protected trace, such that the trace 284 overlays the Kth shielding plane 278. That is, the Kth shielding plane 278 extends beyond the boundaries of the Kth control IC chip 212 and the Kth pad 272 to a region of the laminate substrate 254 that underlies the trace 284. In this manner, the Kth shielding plane 278 provides shielding for the Kth control IC chip 212 and the trace 284 coupled to the Kth control IC chip 212.

The first control IC chip 208 is coupled to a first pad 288 of the patterned DBC layer 249. Additionally, a second pad 290 of the patterned DBC layer 249 is coupled to a tilted pillar 292 of an interconnect, such as a lead frame. The tilted pillar 292 is coupled to a pad 294 of the interconnect, enabling the power converter module 200 to communicate on the system bus 228.

As noted, the power converter module 200 is a multilevel power converter. Each of the K number of control IC chips 204 is dedicated to a particular switching level to control the power transistors (or some subset thereof) for intervals of a particular switching level operations of the power converter module 200. Continuing with the example provided in FIG. 1, where the power converter module 200 has two (2) switching levels, a high side and a low side, a first subset of the power transistors are high side transistors and a second subset are low side transistors. In this situation, there are two control IC chips 204, namely a high side control IC chip, such as the first control IC chip 208 and a low side control IC chip, such as the Kth control IC chip 212. Continuing with this example, in operation, the first control IC chip 208 asserts a high side control signal during a high side switching level and de-asserts the high side control signal during the low side switching level. Assertion of the high side control signal turns on the first subset of power transistors (the high side transistors), causing the first subset of power transistors to operate in the linear region or saturation region. Similarly, de-assertion of the high side control signal turns off the first subset of power transistors, causing the first subset of power transistors to operate in the cutoff region. Additionally, in this example, the Kth control IC chip 212 asserts a low side control signal during a low side switching level and de-asserts the low side control signal during the high side switching level. Assertion of the low side control signal turns on the second subset of the power transistors (the low side transistors), causing the second subset of power transistors to operate in the linear region or saturation region. Similarly, de-assertion of the low side control signal turns off the second subset of power transistors, causing the second subset of power transistors to operate in the cutoff region.

Continuing with this example, the first control IC chip 208 and the Kth control IC chip 212 are configured such that the high side control signal and the low side control signals are complementary signals. Accordingly, the power converter module 200 is configured such that the first set of power transistors or the second set of transistors are turned on, and there is not a time that both the first power transistors and the second transistors are both turned on.

The K number of shielding planes 266 block EMI emanating from the heat sink 232 and toward the power converter module 200, such as EMI emanating in a direction indicated by an arrow 296. As one example, the EMI is generated by an external device, such as an RF receiver or transmitter that is also coupled to the heat sink 232. This blocking of the EMI curtails parasitic capacitive coupling caused by the thermal pad 248, which can interfere with the control signals provided from the control IC chips 204 to the corresponding set of power transistors. As an example, pins of the power converter module 200 have a parasitic capacitance between about 0.02 picofarads (pF) and about 37 pF. Unless otherwise stated, in this description, 'about' preceding a value means +/−10 percent of the stated value. The EMI is present, for example, due to a lack of grounding of the heat sink 232 or insufficient grounding of the heat sink 232. Such EMI, if unblocked, may interfere with the control signals, which in turn, changes an output of the power transistors, thereby distorting an output of the power converter module 200. However, inclusion of the K number of shielding planes 266 along with the patterned ground plane 264 curtails such interference, enabling proper operation of the power converter module 200.

Figure 3:
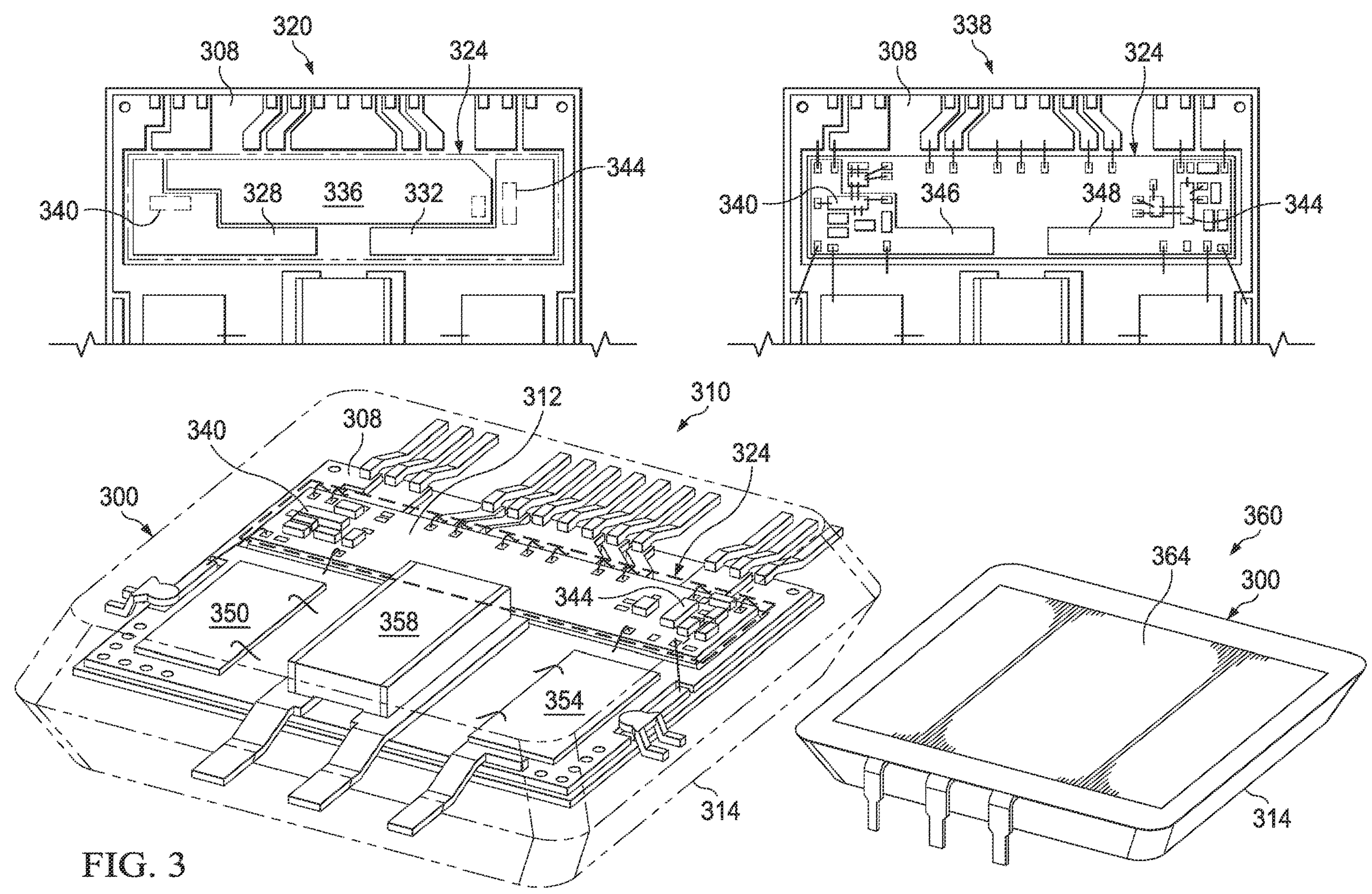
FIG. 3 illustrates a three-dimensional (3D) view of an example of a power converter module with shielding planes.

FIG. 3 illustrates different views of a power converter module 300 that includes shielding for a control module 304. The power converter module 300 is employable to implement the power converter module 100 of FIG. 1 and/or the power converter module 200 of FIG. 2. More particularly, FIG. 3 includes an isometric view 310 of the power converter module 300 that includes a control module 304 mounted on a substrate 308. The control module 304 is employable to implement the control module 252 of FIG. 2. The control module 304 includes a laminate substrate 312, such as the laminate substrate 254 of FIG. 2. The power converter module 300 is circumscribed by a molding 314, such as the molding 216 of FIG. 2. For purposes of illustration, portions of the molding 314 have been removed.

FIG. 3 also includes a first expanded view 320 of a region 324 of the substrate 308, where the laminate substrate 312 is transparent to reveal K number of shielding planes, illustrates a first shielding plane 328, a second shielding plane 332 and a third shielding plane 336 that are electrically isolated from each other. That is, the first shielding plane 328, the second shielding plane 332 and the third shielding plane 336 are situated on a surface (e.g., a bottom surface) of the laminate substrate 312. The first shielding plane 328, the second shielding plane 332 and the third shielding plane 336 are employable to implement the K number of shielding planes 266 of FIG. 2.

FIG. 3 also shows a second expanded view 338 wherein details of a ground plane (e.g., the patterned ground plane 264 of FIG. 3) and a top surface of the laminate substrate 312 are illustrated. In the first expanded view 320 and the second expanded view 338, control IC chips of the power converter module 300 are mounted on the laminate substrate 312. More specifically, the control module 304 includes a low side control IC chip 340 mounted in a region overlying the first shielding plane 328 (wherein the laminate substrate 312 is transparent in the first expanded view 320) and a high side control IC chip 344 is mounted in a region overlaying the second shielding plane 332. Moreover, an isolated controller is mountable on a region overlying the third shielding plane 336. Additionally, the second expanded view 338 includes outlines of a patterned ground plane, such as a first trace 346 in the patterned ground plane that overlays the first shielding plane 328 and a second trace 348 that overlays the second shielding plane 332. Vias (hidden from view)

through the laminate substrate 312 connect the patterned ground plane with the shielding planes.

The power converter module 300 includes power transistors. More specifically, the power converter module 300 includes low side power transistors 350 and high side power transistors 354. The low side power transistors 350 are controlled by the low side control IC chip 340 of the control module 304, and the high side power transistors 354 are controlled by the high side control IC chip 344 of the control module 304. In some examples, the low side power transistors 350 and the high side power transistors 354 are implemented as GaN FETs, such as N-channel GaN FETs. In other examples, transistors such as SiC FETs or GaO FETs are employable as the low side power transistors 350 and the high side power transistors 354. In still other examples, the low side power transistors 350 and the high side power transistors 354 are implemented as metal oxide semiconductor field effect transistors (MOSFETs). In still other examples, the low side power transistors 350 and the high side power transistors 354 are implemented as bipolar junction transistors (BJTs). The power converter module 300 also includes decoupling capacitors 358. The decoupling capacitors 358 are mounted on the substrate 308 of the power converter module 300.

FIG. 3 still further includes a fourth view 360 that illustrates the power converter module 300, wherein a thermal pad 364 is adhered to the molding 314. The thermal pad 364 is employable to implement the thermal pad 248 of FIG. 2 and is configured to be coupled to a heat sink (e.g., the heat sink 232 of FIG. 2).

As illustrated, the power converter module 300 is fabricated such that shielding planes, such as the first shielding plane 328, the second shielding plane 332 or the third shielding plane 336 underlies the low side control IC chip 340 and the high side control IC chip 344. Accordingly, in situations where the power converter module 300 is connected to a system bus (e.g., the system bus 228 of FIG. 2) and thermally coupled to the heat sink through the thermal pad 364, the first shielding plane 328, the second shielding plane 332 and the third shielding plane 336 block EMI radiating from the heat sink to curtail an impact of the EMI on an operation of the control module 304.

Figure 4:
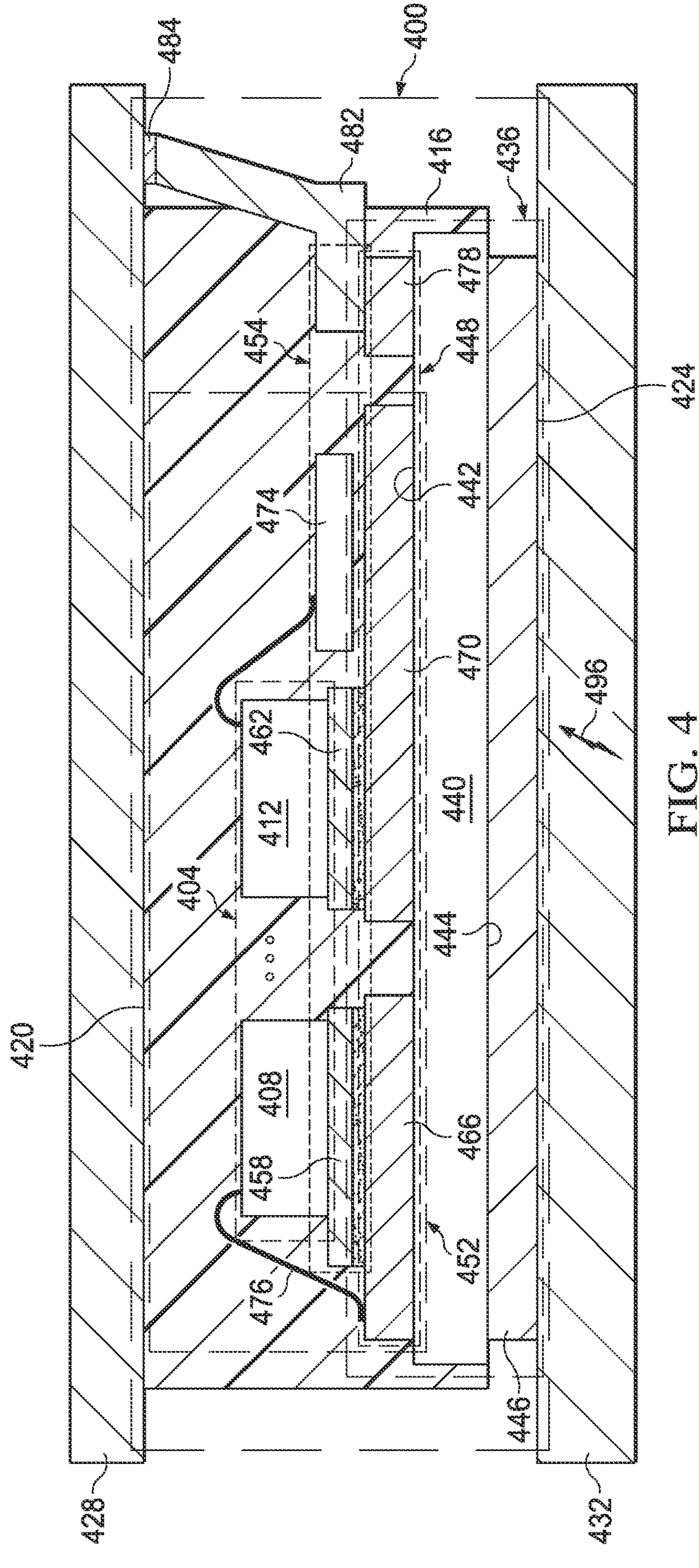
FIG. 4 illustrates a cross-section diagram of yet another example of a power converter module with shielding planes.

FIG. 4 illustrates a cross-section diagram of another example of a power converter module 400 formed with selective shielding for control IC chips. The power converter module 400 is employable to implement the power converter module 100 of FIG. 1. The power converter module 400 is a multilevel switching power converter. In one example, the power converter module 400 is a multilevel DC-to-DC converter, such as a buck converter (a step-up converter) or a boost converter (a step-down converter). As another example, the power converter module 400 is a multilevel AC-to-DC converter, such as a half-bridge power converter or a full bridge power converter. In still other examples, the power converter module 400 is a multilevel DC-to-AC converter (e.g., an inverter). For the examples illustrated, it is presumed that the power converter module 400 is a DC-to-DC converter.

The power converter module 400 is fabricated with K number of control IC chips 404 that control power transistors to output high power, such as a range from about 100 V to about 700 V and a range of about 20 A to about 250 A, where K is an integer greater than or equal to two (2). In the example illustrated, there is a first control IC chip 408 and a Kth control IC chip 412, but in other examples there are more than two (2) control IC chips. In various examples, the power transistors are implemented as GaN FETs, but in other examples, other types of transistors, such as GaO SiC transistors are also employable. In such examples, each of the K number of control IC chips 404 provides a corresponding control signal to a control node (e.g., a gate or base) of a subset of the power transistors.

The power converter module 400 is encased in a molding 416, such as plastic. The power converter module 400 includes a first side 420 and a second side 424, wherein the first side 420 and the second side 424 are opposing sides. In the example illustrated, the first side 420 of the power converter module 400 is mounted on a system bus 428. In some examples, the system bus 428 is a communication bus for an external system, such as a communication bus of an automotive system. The second side 424 of the power converter module 400 is mounted to be in thermal communication with a heat sink 432, which is alternatively referred to as a cold plate. Accordingly, heat generated by the power converter module 400 is transferred to the heat sink 432 and dissipated.

The power converter module 400 includes a substrate 436 that is formed with a ceramic core 440. The ceramic core 440 includes a first surface 442 and a second surface 444, wherein the first surface 442 opposes the second surface 444. A thermal pad 446 is situated on the second surface 444 of the ceramic core 440. The thermal pad 446 is formed of a conductive material (e.g., copper) that is in thermal communication with the heat sink 432.

The first surface 442 of the ceramic core 440 has a patterned DBC layer 448 to enable mounting of the K number of control IC chips 404 of a control module 452. More specifically, an interconnect 454 (e.g., a lead frame) is mounted on the patterned DBC layer 448, and the K number of control IC chips 404 are mounted on the interconnect 454. That is, in the power converter module 400, the K number of control IC chips 404 of the control module 452 are mounted on the interconnect 454, which, in turn is mounted on the patterned DBC layer 448.

The patterned DBC layer 448 incudes K number (or more) of shielding planes that are electrically isolated from each other, whereby a portion of the interconnect 454 is mounted on a corresponding shielding plane. The first control IC chip 408 is mounted on a first pad 458 of the interconnect 454, and the Kth control IC chip 412 is mounted on a Kth pad 462 of the interconnect 454. The first pad 458 of the interconnect 454 overlays a first shielding plane 466 of the patterned DBC layer 448 and a Kth pad 462 of the interconnect 454 overlays a Kth shielding plane 470 of the patterned DBC layer 448.

Further, in an example illustrated, a trace 474 (e.g., a protected trace) of the interconnect 454. The trace 474 is situated over the Kth shielding plane 470 of the patterned DBC layer 448. Accordingly, the Kth shielding plane 470 extends beyond the boundaries of the Kth control IC chip 412 to a region that underlies the trace 474. Additionally, the trace 474 is electrically isolated from the Kth shielding plane 470. In some examples, molding compound (or other electrically insulating material) separates the trace 474 from the Kth shielding plane 470. In this manner, the Kth shielding plane 470 provides shielding for the Kth control IC chip 412 and the trace 474 coupled to the Kth control IC chip 412.

The first control IC chip 408 is coupled to the first pad 458 of the interconnect 454 with a wire bond 476. Additionally, a pad 478 of the patterned DBC layer 448 is coupled to a tilted pillar 482 of the interconnect 454. The tilted pillar 482 is coupled to a pad 484 of the system bus 428, enabling the power converter module 400 to communicate on the system bus 428.

As noted, the power converter module 400 is a multilevel power converter. Each of the K number of control IC chips 404 is dedicated to a particular switching level to control the power transistors (or some subset thereof) for intervals of a particular switching level operations of the power converter module 400. Continuing with the example provided in FIG. 1, where the power converter module 400 has two (2) switching levels, a high side and a low side, a first subset of the power transistors are high side transistors and a second subset are low side transistors. In this situation, there are two control IC chips 404, namely a high side control IC chip, such as the first control IC chip 408 and a low side control IC chip, such as the Kth control IC chip 412. Continuing with this example, in operation, the first control IC chip 408 asserts a high side control signal during a high side switching level and de-asserts the high side control signal during the low side switching level. Assertion of the high side control signal turns on the first subset of power transistors (the high side transistors), causing the first subset of power transistors to operate in the linear region or saturation region. Similarly, de-assertion of the high side control signal turns off the first subset of power transistors, causing the first subset of power transistors to operate in the cutoff region. Additionally, in this example, the Kth control IC chip 412 asserts a low side control signal during a low side switching level and de-asserts the low side control signal during the high side switching level. Assertion of the low side control signal turns on the second subset of the power transistors (the low side transistors), causing the second subset of power transistors to operate in the linear region or saturation region. Similarly, de-assertion of the low side control signal turns off the second subset of power transistors, causing the second subset of power transistors to operate in the cutoff region.

Continuing with this example, the first control IC chip 408 and the Kth control IC chip 412 are configured such that the high side control signal and the low side control signals are complementary signals. Accordingly, the power converter module 400 is configured such that the first set of power transistors or the second set of transistors are turned on, and there is not a time that both the first power transistors and the second transistors are both turned on.

The K number of shielding planes on the patterned DBC layer 448 block EMI emanating from the heat sink 432 and toward the power converter module 400, such as EMI emanating in a direction indicated by an arrow 496. As one example, the EMI generated by an external device, such as an RF receiver or transmitter that is also coupled to the heat sink 432. This blocking of the EMI curtails parasitic capacitive coupling caused by the thermal pad 446, which can interfere with the control signals provided from the control IC chips 404 to the corresponding set of power transistors. As an example, pins of the power converter module 200 have a parasitic capacitance between about 0.06 pF and about 38 pF. This blocking of the EMI curtails the impact of the EMI on the control signals provided from the control IC chips 404 to the corresponding set of power transistors. The EMI is present, for example, due to a lack of grounding of the heat sink 432 or insufficient grounding of the heat sink 432. Such EMI, if unblocked, may interfere with the control signals, which in turn, changes an output of the power transistors, thereby distorting an output of the power converter module 400. However, inclusion of the K number of shielding planes along with the patterned DBC layer 448 curtails such interference, enabling proper operation of the power converter module 400.

As compared to the power converter module 200 of FIG. 2, the power converter module 400 does not have the control module 252 that includes the laminate substrate 254. Instead, the control IC chips 404 of the control module 452 are mounted on the interconnect 454, which in turn is mounted on the patterned DBC layer 448. Accordingly, the power converter module 400 has a lower implementation cost than the power converter module 200, at a cost of a reduced ability to block the EMI.

Figure 5A:
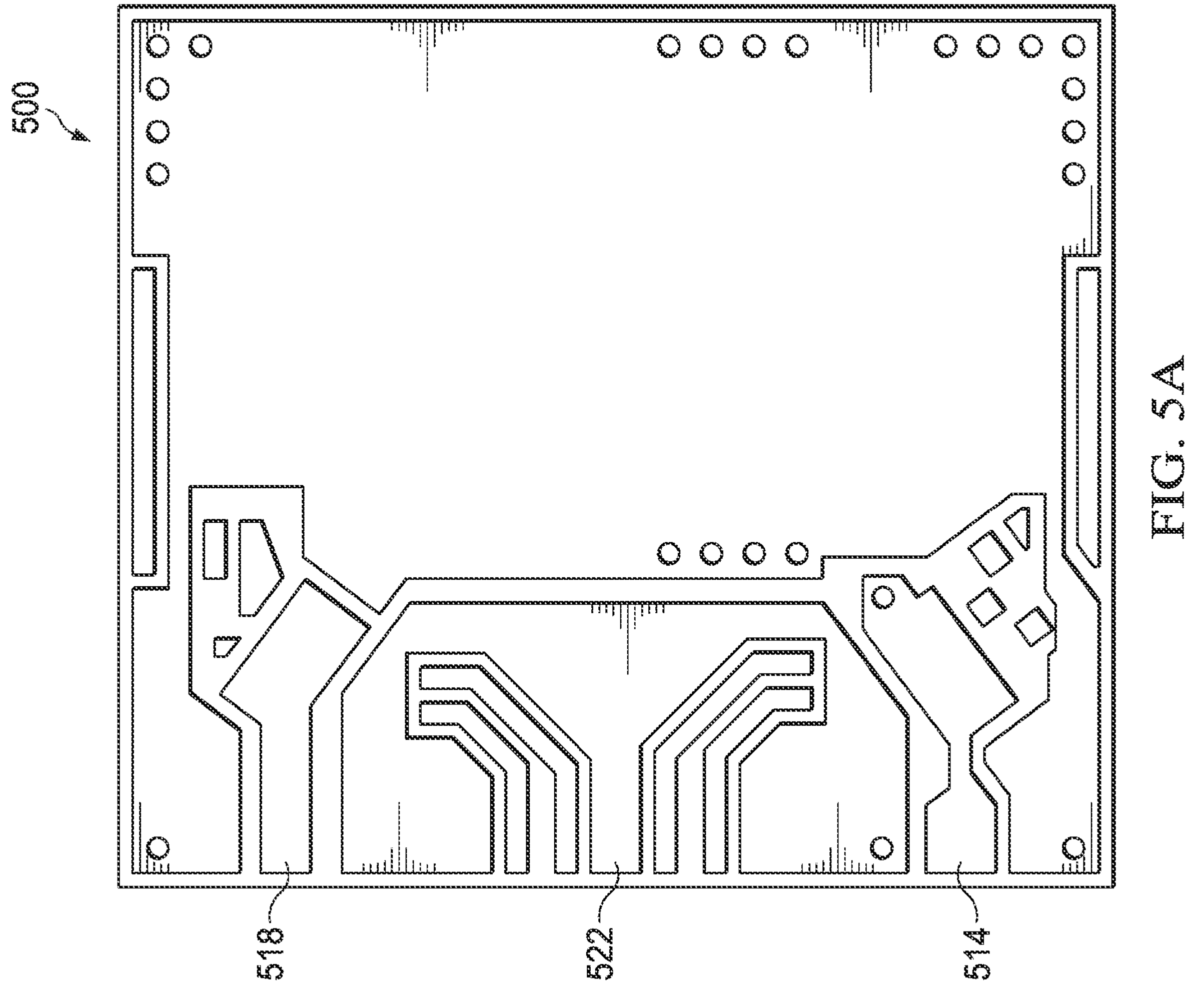
FIG. 5A illustrates an example of a patterned direct bonded copper (DBC) layer for a power converter module.
Figure 5B:
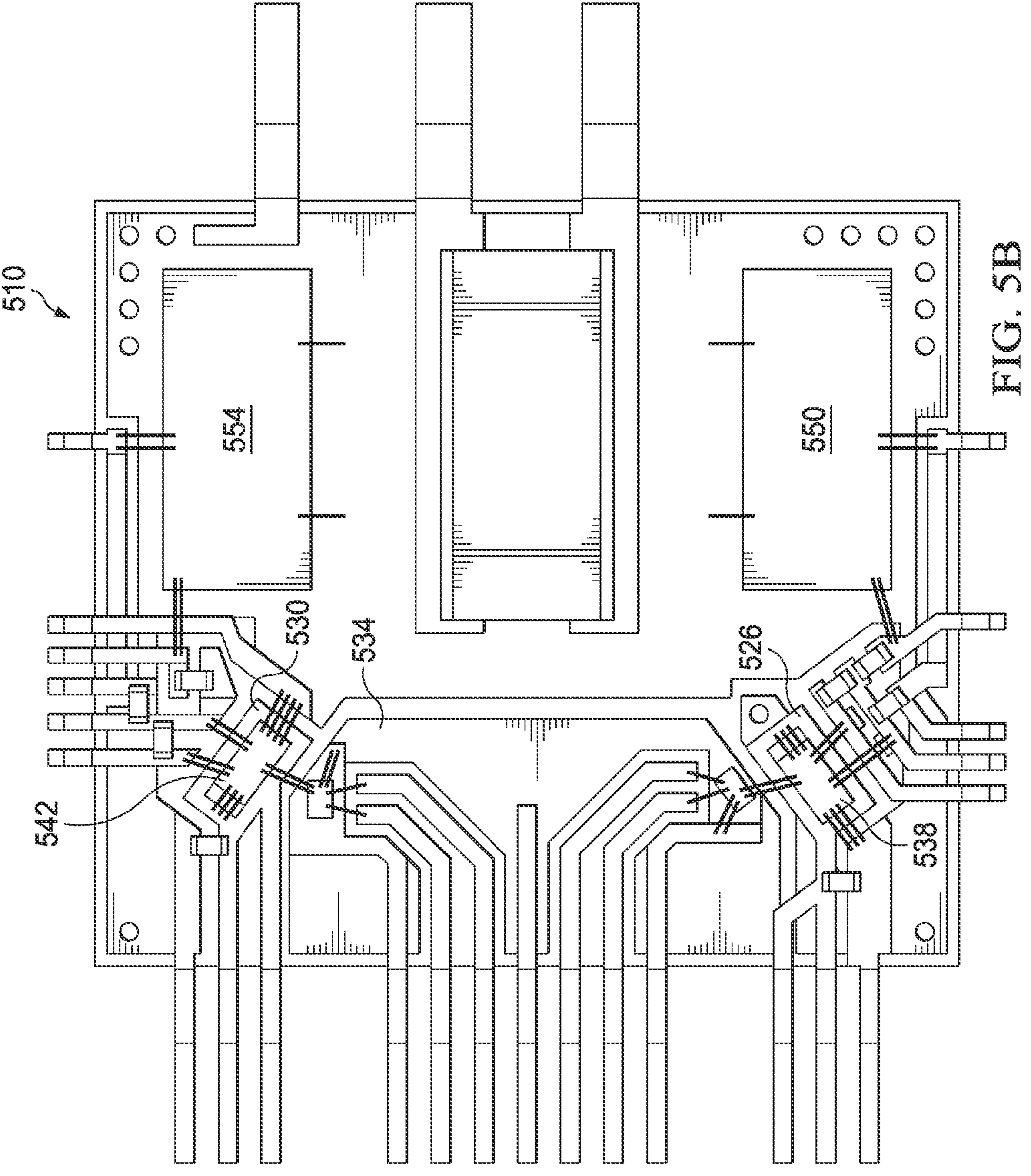
FIG. 5B illustrates an example of an interconnect for a power converter module.

FIG. 5A illustrates a patterned DBC layer 500 for a power converter module that is employable to implement the patterned DBC layer 448 of FIG. 4. FIG. 5B illustrates an interconnect 510 for the power converter module that is mountable on the patterned DBC layer 500 of FIG. 5A.

The patterned DBC layer 500 as illustrated in FIG. 5A has a first shielding plane 514, a second shielding plane 518 and a third shielding plane 522 that are electrically isolated from each other. As illustrated in FIG. 5B, the interconnect 510 includes a first pad 526, a second pad 530, and a third pad 534. The interconnect 510 has a low side control IC chip 538 mounted on the first pad 526, and a high side control IC chip 542 mounted on the second pad 530. The interconnect 510 is arranged such that the first pad 526 overlies the first shielding plane 514 of the patterned DBC layer 500 illustrated in FIG. 5A, the second pad 530 overlies the second shielding plane 518 of the patterned DBC layer 500 illustrated in FIG. 5A and the third pad 534 overlies the third shielding plane 522 of FIG. 5A.

The interconnect 510 includes power transistors mounted thereon, namely low side power transistors 550 and high side power transistors 554. The low side power transistors 550 are controlled by the low side control IC chip 538, and the high side power transistors 554 are controlled by the high side control IC chip 542. In some examples, the low side power transistors 550 and the high side power transistors 554 are implemented as GaN FETs, such as N-channel GaN FETs. In other examples, transistors such as SiC FETs or GaO FETs are employable as the low side power transistors 550 and the high side power transistors 554. In still other examples, the low side power transistors 550 and the high side power transistors 554 are implemented as MOSFETS. In still other examples, the low side power transistors 550 and the high side power transistors 554 are implemented as BJTs.

As illustrated, the patterned DBC layer 500 and the interconnect 510 of the power converter module are fabricated such that a shielding plane, such as the first shielding plane 514, the second shielding plane 518 or the third shielding plane 522 underlies control IC chips, including the low side control IC chip 538 and the high side control IC chip 542. Accordingly, in situations where the power converter module is connected to a system bus (e.g., the system bus 428 of FIG. 4) and thermally coupled to the heat sink, the first shielding plane 514, the second shielding plane 518 or the third shielding plane 522 block EMI radiating from the heat sink to curtail an impact of the EMI on an operation of the power converter module.

Figure 6:
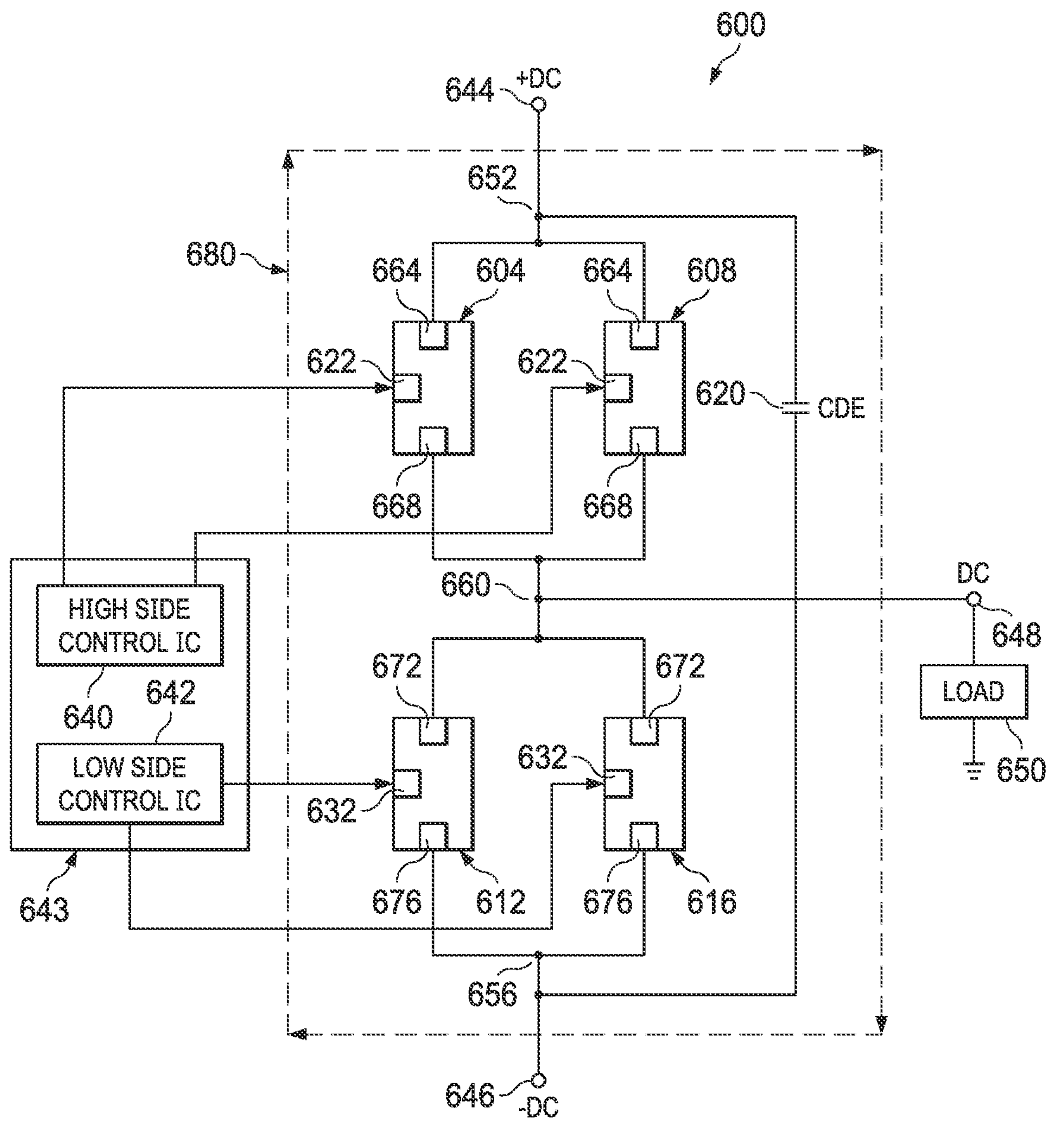
FIG. 6 illustrates a circuit diagram of a power converter module that implements a direct current (DC) to DC converter.

FIG. 6 illustrates a simplified circuit diagram of a power converter module 600. The power converter module 600 is illustrated as a DC-to-DC power converter. Moreover, the power converter module 600 is employable to implement the power converter module 100 of FIG. 1, the power converter module 200 of FIG. 2, the power converter module 300 of FIG. 3 and/or the power converter module 400 of FIG. 4.

The power converter module 600 includes a first high side transistor 604 and a second high side transistor 608. The first high side transistor 604 and the second high side transistor

608 correspond to the high side power transistors 354 of FIG. 3. The power converter module 600 also includes a first low side transistor 612 and a second low side transistor 616. The first low side transistor 612 and the second low side transistor correspond to the low side power transistors 350 of FIG. 3. The power converter module 600 includes a decoupling capacitor 620 that corresponds to one or more of the decoupling capacitors 358 of FIG. 3. In the example illustrated, it is presumed that the first high side transistor 604, the second high side transistor 608, the first low side transistor 612 and the second low side transistor 616 are GaN FETs. However, in other examples, other types of transistors, such as SiC FETs and GaO FETs, MOSFETS or BJTs are employable.

The first high side transistor 604 and the second high side transistor 608 include a control node 622 (e.g., a gate or a base) that receives a high side control signal from a high side control IC chip 640. In some examples, the high side control signal provided to the control node 622 of the first high side transistor 604 and the control node 622 of the second high side transistor 608 are synchronous. Similarly, the first low side transistor 612 and the second low side transistor 616 include a control node 632 (e.g., a gate or a base) that receives a low side control signal from a low side control IC chip 642. In some examples, the low side control signal provided to the control node 632 of the first low side transistor 612 and the second low side transistor 616 are synchronous. Moreover, in some such examples, the high side control signal provided to the control node 622 of the first high side transistor 604 and the second high side transistor 608 are complements of the low side control signal provided to the control node 632 of the first low side transistor 612 and the second low side transistor 616.

The high side control IC chip 640 and the low side control IC chip 642 are mounted on a control module 643 (e.g., the control module 148 of FIG. 1) and are employable to implement control IC chips, such as the control IC chips 104 of FIG. 1. Accordingly, the high side control IC chip 640 and the low side control IC chip 642 overlie shielding planes (e.g., the shielding planes 152 of FIG. 1) to block EMI emanating from a heat sink (e.g., the heat sink 132 of FIG. 1).

The power converter module 600 includes a positive DC input terminal 644 and a negative DC input terminal 646. The power converter module 600 also includes a DC output terminal 648. The DC output terminal 648 is coupled to a load 650 that is external to the power converter module 600. The positive DC input terminal 644 is coupled to a first input node 652 of the power converter module 600. The negative DC input terminal 646 is coupled to a second input node 656 of the power converter module 600. Additionally, the DC output terminal 648 is coupled to an output node 660 of the power converter module 600.

A first node of the decoupling capacitor 620 is coupled to the first input node 652 of the power converter module 600 and a second node of the decoupling capacitor 620 is coupled to the second input node 656. The first high side transistor 604 and the second high side transistor 608 include an input node 664 (e.g., a drain or collector) that is coupled to the first input node 652. The first high side transistor 604 and the second high side transistor 608 include an output node 668 (e.g., a source or emitter) that is coupled to the output node 660.

The first low side transistor 612 and the second low side transistor 616 include an input node 672 (e.g., a drain or collector) that is coupled to the output node 660 of the power converter module 600. The first low side transistor 612 and the second low side transistor 616 include an output node 676 (e.g., a source or emitter) that is coupled to the negative DC input terminal 646.

In operation, current flows in a current path 680 that traverses the decoupling capacitor 620, the first high side transistor 604, the second high side transistor 608, the first low side transistor 612 and the second low side transistor 616. The current path 680 forms a loop. However, as illustrated, if the first high side transistor 604, the second high side transistor 608, the first low side transistor 612 and the second low side transistor 616 are each turned on concurrently (e.g., operating in the linear or saturation region), a low resistance path (e.g., near a short circuit) between the positive DC input terminal 644 and the negative DC input terminal 646 occurs. Such a low resistance path can damage a power source (e.g., a battery) coupled to the positive DC input terminal 644 and the negative DC input terminal 646. Thus, as noted, the high side control signal provided by the high side control IC chip 640 and the low side control signal provided by the low side control IC chip 642 are complementary, thereby ensuring that at a given time, that the low side power transistors (e.g., the first low side transistor 612 and the second low side transistor 616) or the high side power transistors (e.g., the first high side transistor 604 and the second high side transistor 608) are turned off (operating in the cutoff region). However, without shielding planes (e.g., the shielding planes 152 of FIG. 1), EMI emanating from a heat sink may distort the high side control signal provided by the high side control IC chip 640 or the low side control signal provided by the low side control IC chip 642. In some situations, such distortion may result in the low side power transistors (e.g., the first low side transistor 612 and the second low side transistor 616) and the high side power transistors (e.g., the first high side transistor 604 and the second high side transistor 608) being turned on at the same time, causing the low resistance path mentioned above. However, inclusion of the shielding planes blocks this EMI emanating from the heat sink to curtail interference with the high side control signal provided by the high side control IC chip 640 and the low side control signal provided by the low side control IC chip 642 to enable proper operation of the power converter module 600.

FIGS. 7-13 illustrate stages of a method for fabricating a power converter module, such as the power converter module 100 of FIG. 1, the power converter module 200 and/or the power converter module 300 of FIG. 3 The method of FIGS. 7-13 illustrates how shielding planes are provided for control IC chips of a control module for the power converter module.

Figure 7:
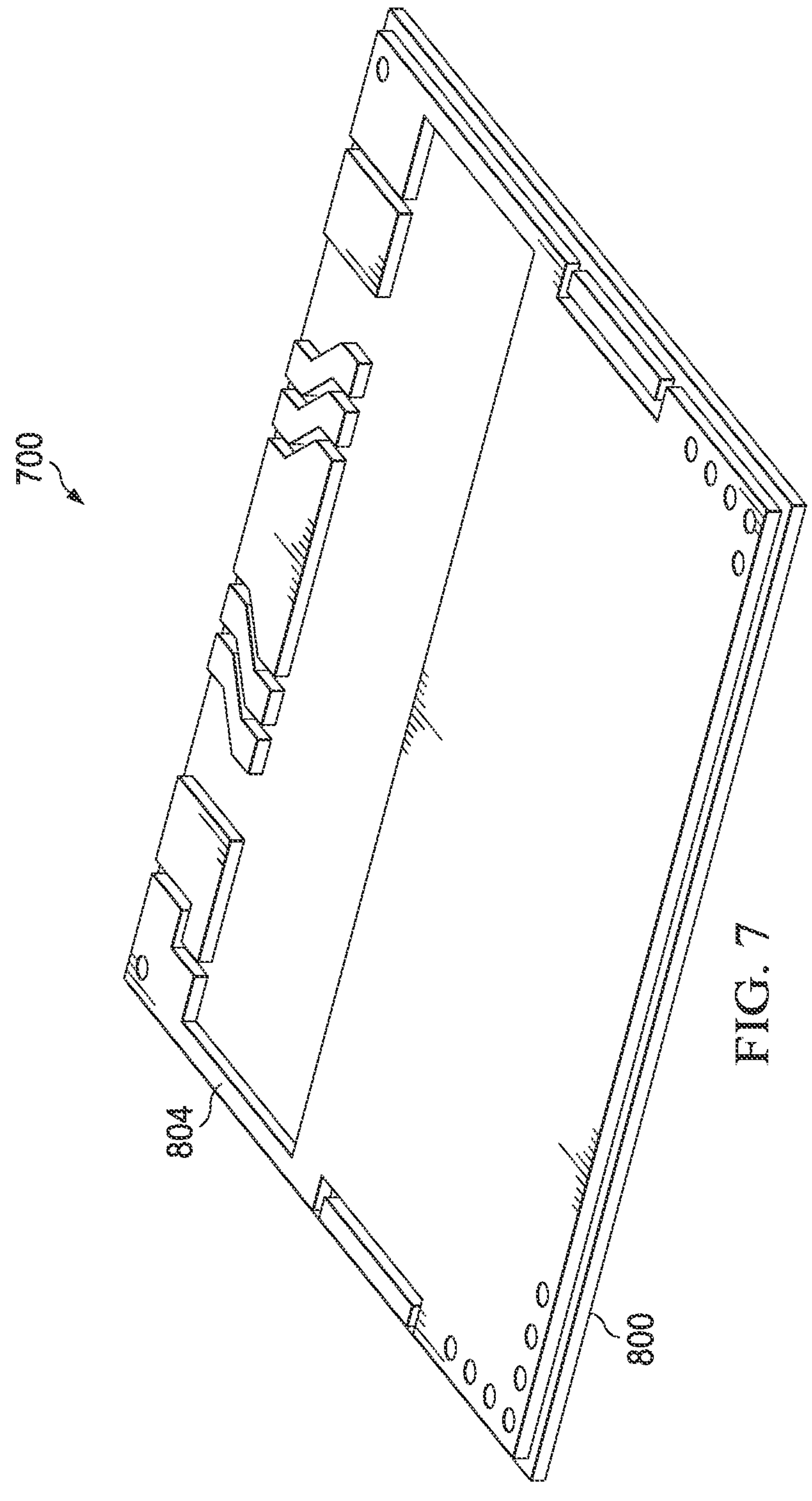
FIG. 7 illustrates a first stage of a method for fabricating a power converter module.
Figure 8:
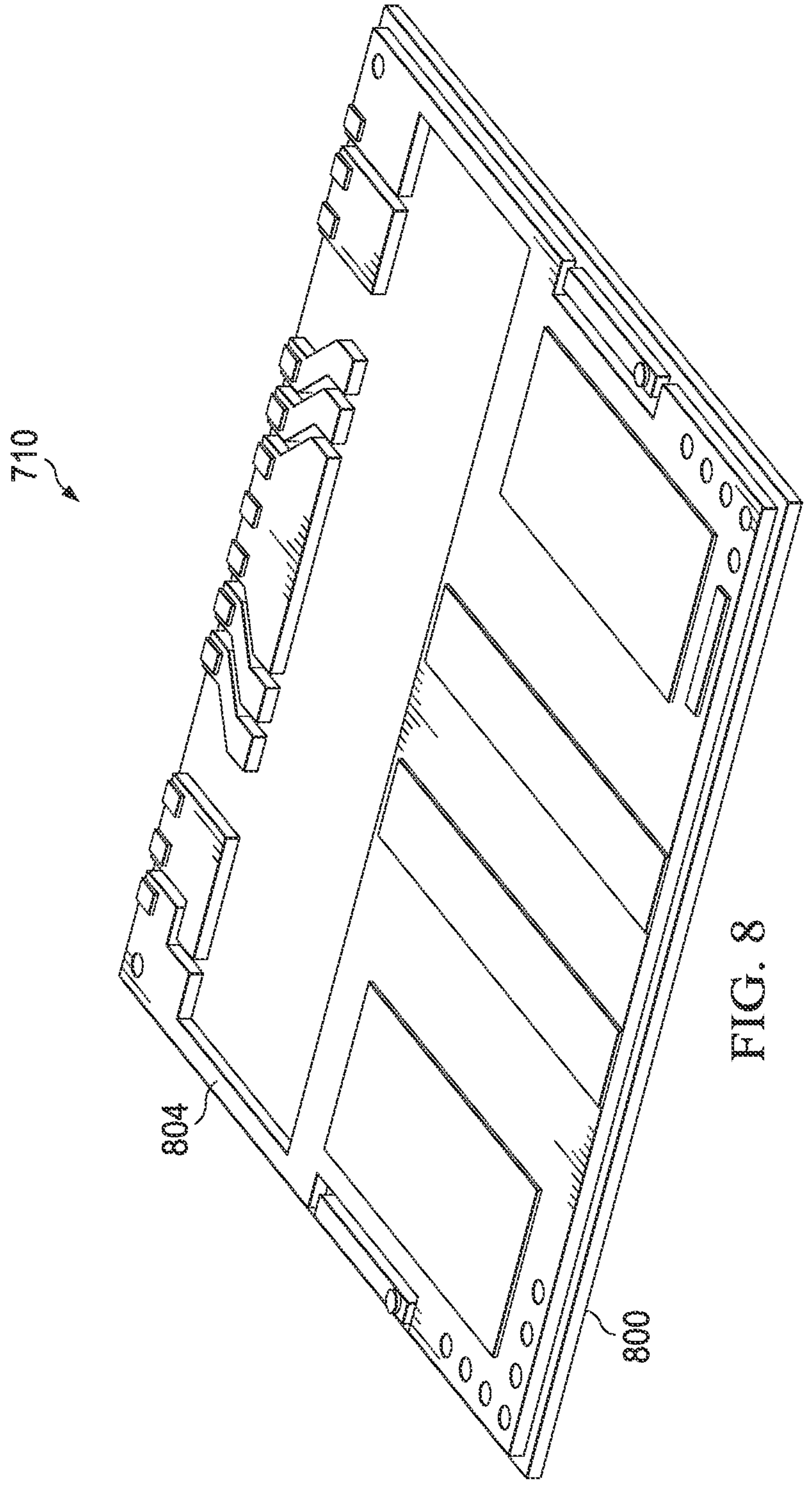
FIG. 8 illustrates a second stage of a method for fabricating the power converter module.
Figure 9:
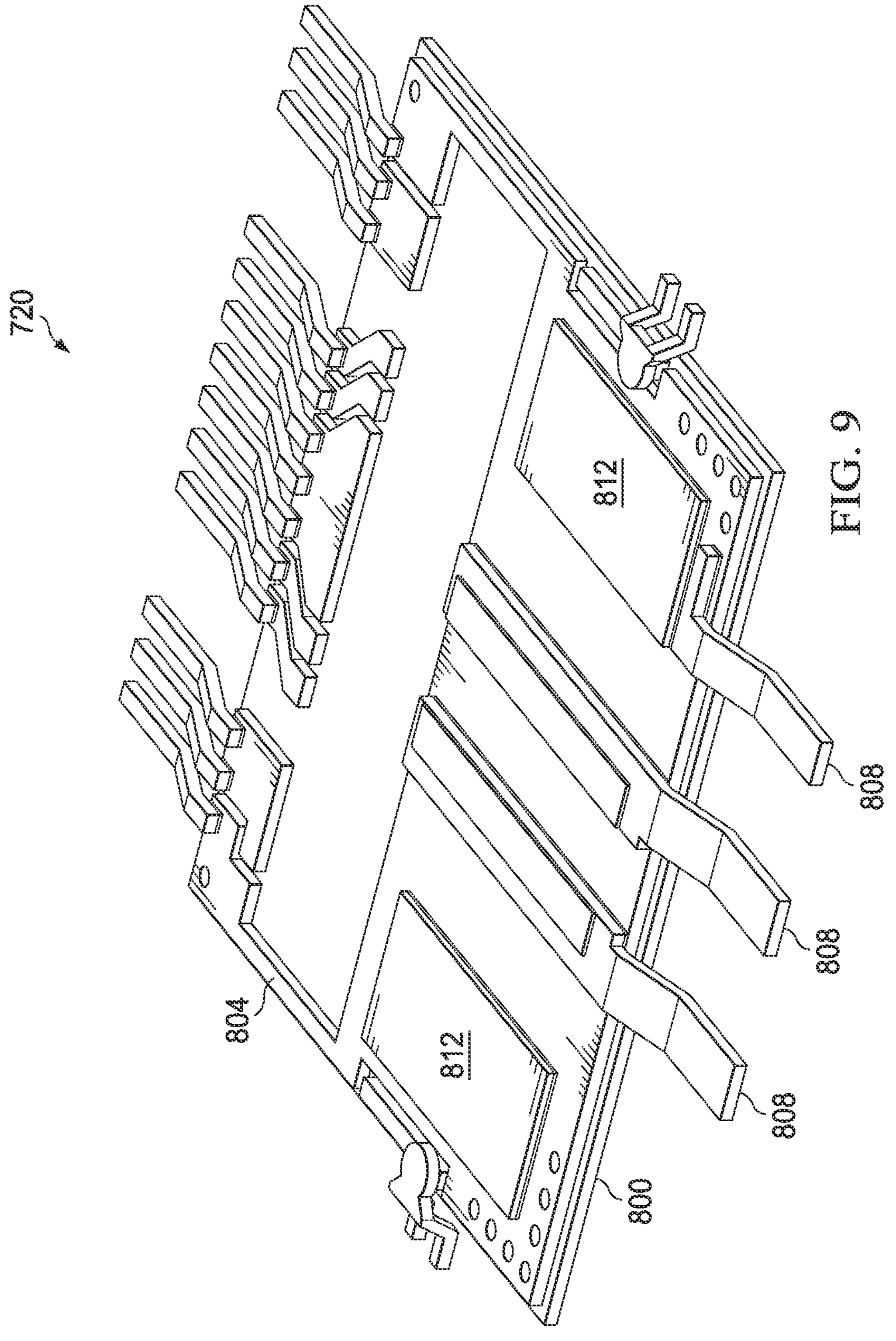
FIG. 9 illustrates a third stage of a method for fabricating the power converter module.

As illustrated in FIG. 7, at 700, in a first stage, a substrate 800 with a patterned DBC layer 804 is formed. The substrate 800 is employable to implement the substrate 136 of FIG. 1 and/or the substrate 236 of FIG. 1. As illustrated in FIG. 8, in a second stage, at 710, the patterned DBC layer 804 is etched to provide mounting positions for power transistors (e.g., the low side power transistors 350 and the high side power transistors 354 of FIG. 3). As illustrated in FIG. 9, in a third stage, at 720, connection leads 808 (only some of which are labeled) for an interconnect are formed on the patterned DBC layer 804. Additionally, the power transistors 812 are mounted on the substrate 800.

Figure 10:
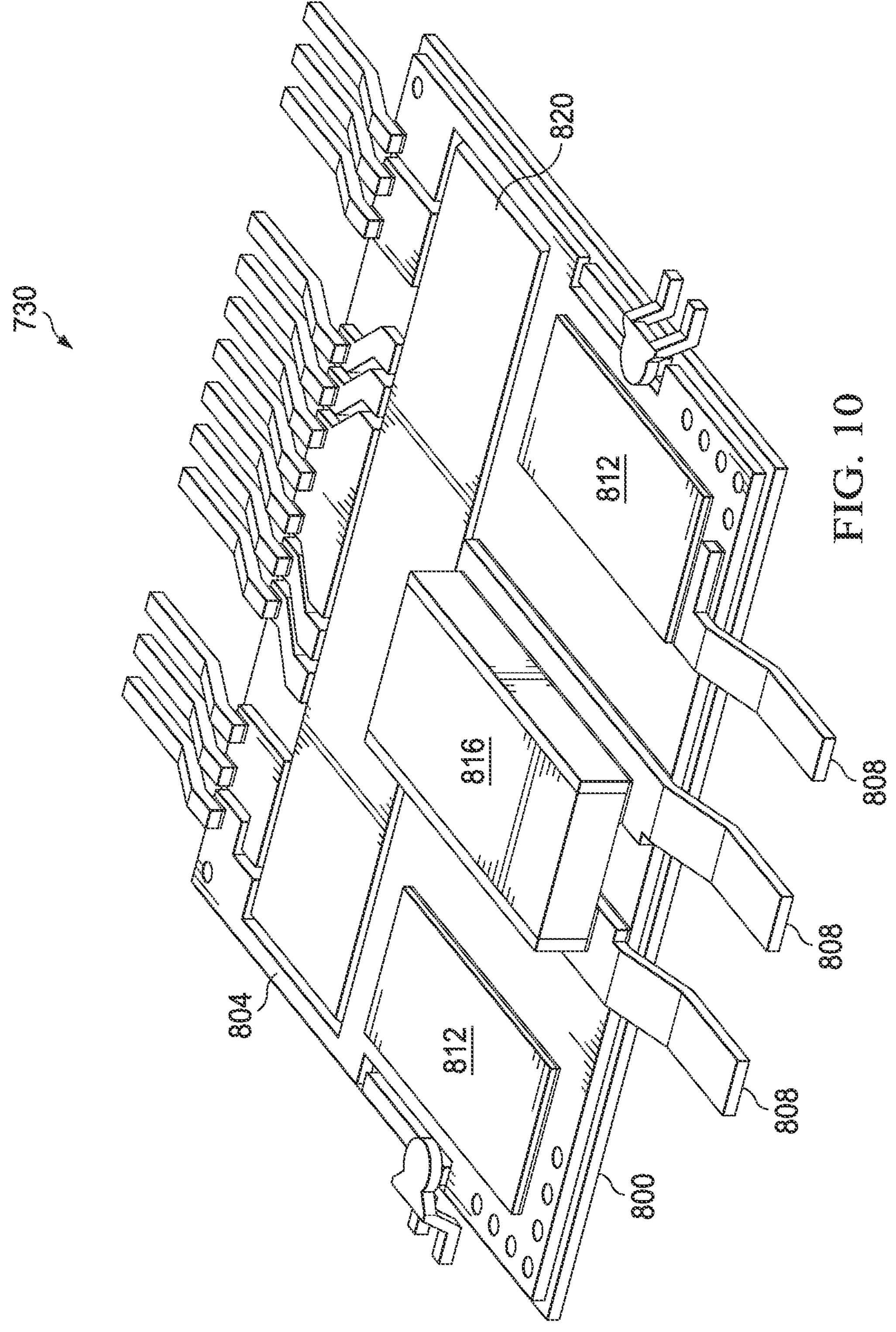
FIG. 10 illustrates a fourth stage of a method for fabricating the power converter module.
Figure 11:
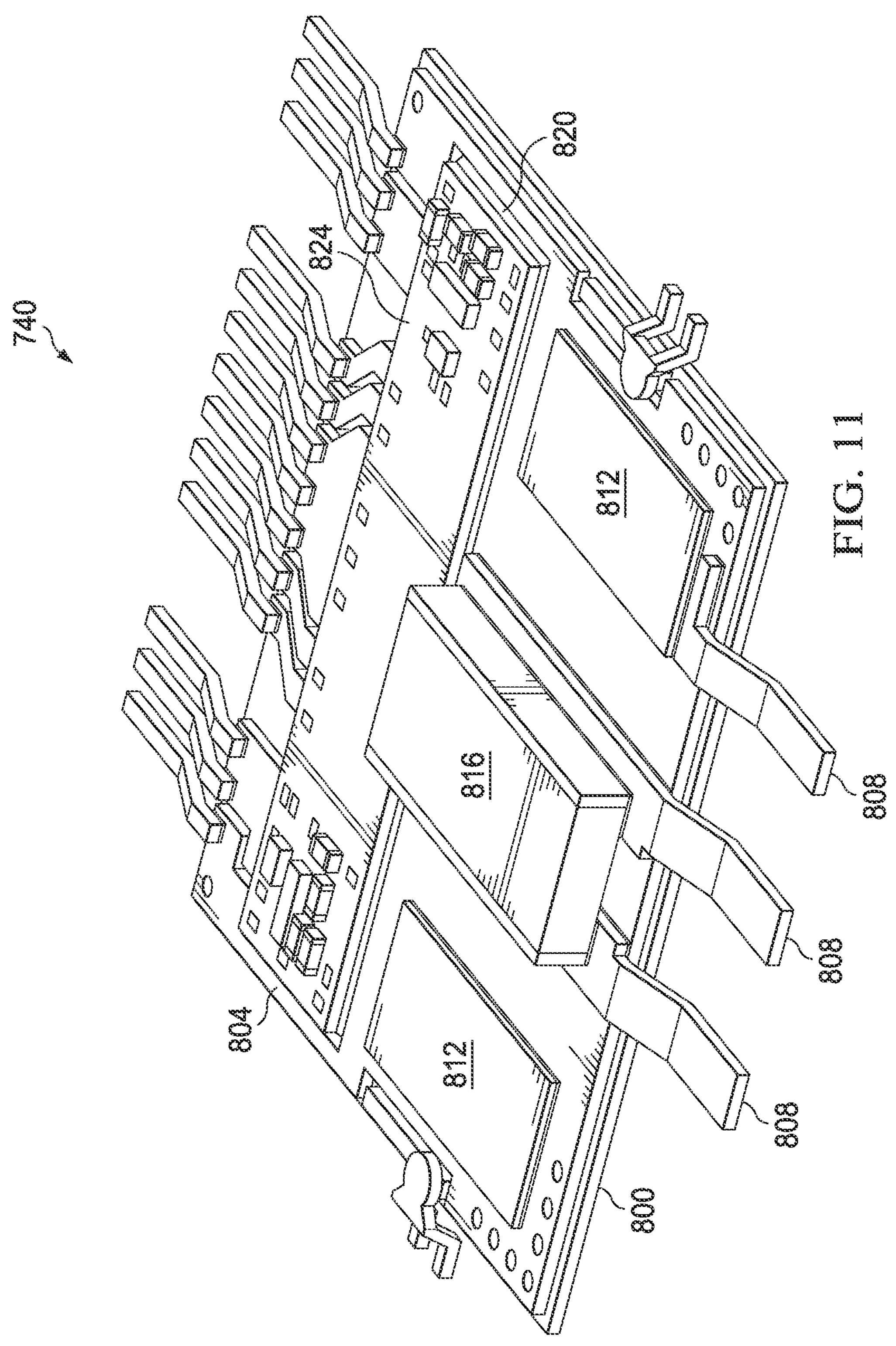
FIG. 11 illustrates a fifth stage of a method for fabricating the power converter module.

As illustrated in FIG. 10, in a fourth stage, at 730, decoupling capacitors 816 are mounted on the leads 808. Additionally, in the fourth stage, a solder 820 is applied to the substrate 800 to enable mounting of a control module. As illustrated in FIG. 11, in a fifth stage, at 740, the control module 824 is mounted on the solder 820. The control module 824 is employable to implement the control module 148 of FIG. 1, the control module 252 of FIG. 2 and/or the control module 304 of FIG. 3. Accordingly, mounting the control module 824 also mounts control IC chips mounted on the control module 304 for the power converter module.

Figure 12:
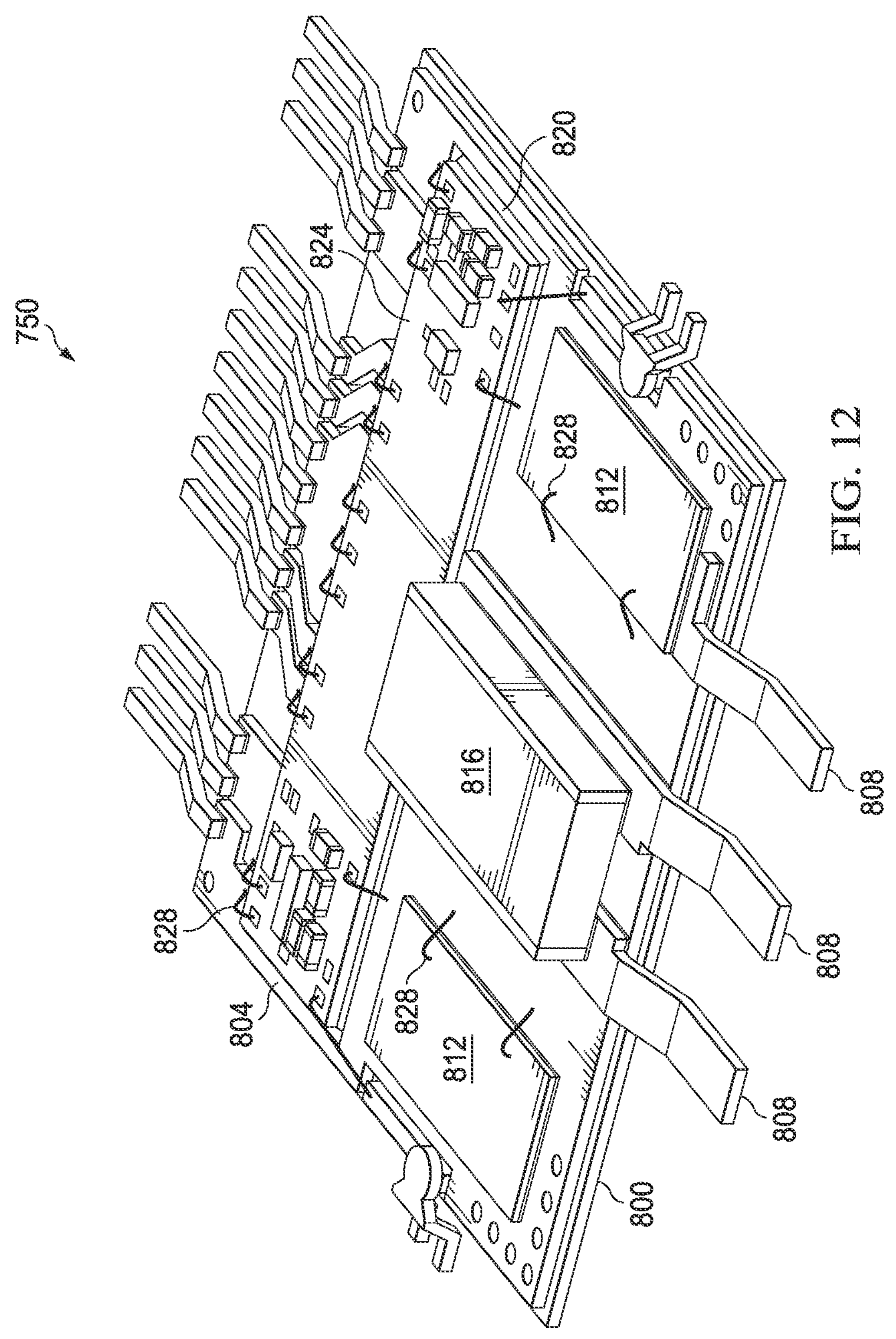
FIG. 12 illustrates a sixth stage of a method for fabricating the power converter module.
Figure 13:
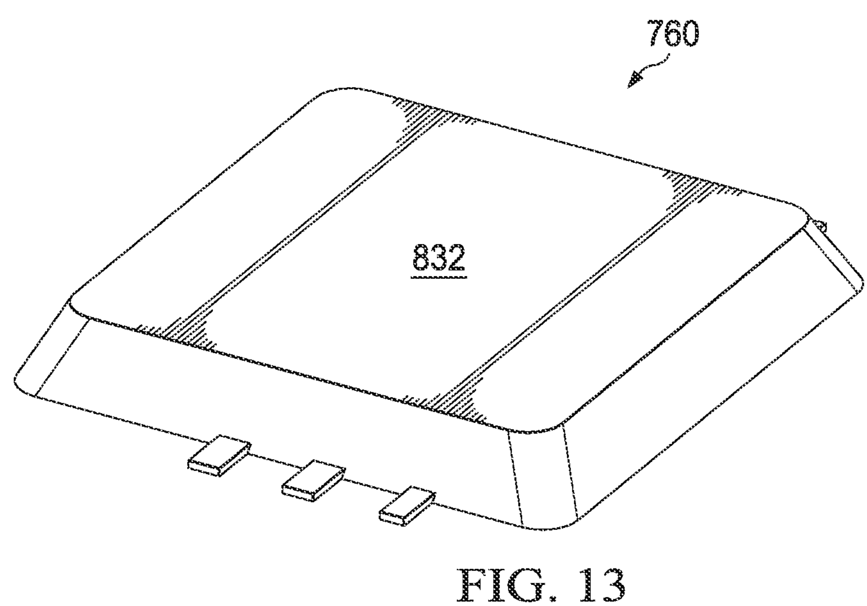
FIG. 13 illustrates a seventh stage of a method for fabricating the power converter module.

As illustrated in FIG. 12, in a six stage, at 750, wire bonds 828 (only some of which are labeled) are applied to couple various components of the power converter module. Such wire bonds 828 couple components (e.g., control IC chips) mounted on the control module 824 with the power transistors 812. As illustrated in FIG. 13, in a seventh stage, at 760, a molding 832 is applied to form the power converter module. The molding 832 is employable to implement the molding 116 of FIG. 1.

Figure 14:
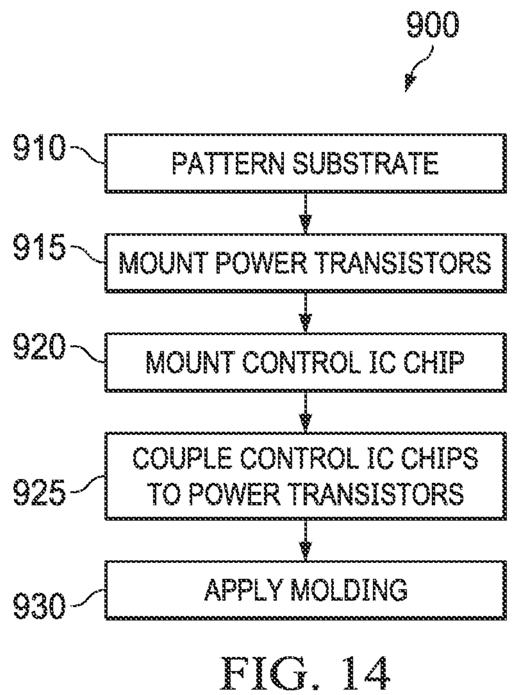
FIG. 14 illustrates a flowchart of an example method for fabricating a power converter module.

FIG. 14 illustrates a flowchart of an example method 900 for fabricating a power converter module, such as the power converter module 100 of FIG. 1, the power converter module 200 of FIG. 2, the power converter module 300 of FIG. 3, the power converter module 400 of FIG. 4 and/or the power converter module of FIG. 5A and FIG. 5B. At 910, a DBC layer is patterned on a first surface of a substrate (e.g., the substrate 136 of FIG. 1) with a region for a control module (e.g., the control module 148 of FIG. 1). The substrate includes a thermal pad (e.g., the thermal pad 248 of FIG. 2 or the thermal pad 446 of FIG. 4) on a second surface (opposing the first surface) of the substrate for thermally coupling the power converter module to a heat sink (e.g., the heat sink 132 of FIG. 1). At 915, power transistors (e.g., the low side power transistors 350 and the high side power transistors 354 of FIG. 3 or the low side power transistors 550 and the high side power transistors 554 of FIG. 5B) are mounted on the substrate.

At 920, control IC chips (e.g., the K number of control IC chips 104 of FIG. 1) are mounted on a region that overlies the control module. The control IC chips are mounted such that shielding planes (e.g., the K number of shielding planes 266 of FIG. 1) are situated between the control IC chips and the thermal pad on the second surface of the substrate. Accordingly, a first shielding plane of the shielding planes underlies a first control IC of the control IC chips, and a second shielding plane of the shielding planes underlies a second control IC of the control IC chips. Furthermore, in some examples, the first shielding plane and/or the second shielding plane underlie a trace (e.g., a protected trace) of the control module.

In some examples, the control IC chips are mounted on a laminate substrate of the control module. In such situations, the control IC chips are mounted on pads of a patterned ground plane on a first surface of the laminate substrate, and the shielding planes are situated on a second surface of the laminate substrate. In other examples, the control module does not include a laminate substrate. In such a situation, the shielding planes are formed on the patterned DBC layer of the first surface of the substrate, and a pads of an interconnect are mounted on the patterned DBC layer. In these examples, the control IC chips are mounted on the pads of the interconnect.

At 925, the control IC chips are coupled to the power transistors (e.g., through wire bonds and/or traces). At 930, molding is applied to the power converter module, to enable the power converter module to be connected to a system bus (e.g., the system bus 128) and thermally coupled to the heat sink.

Modifications are possible in the described embodiments, and other embodiments are possible, within the scope of the claims.

What is claimed is:

1. An apparatus, comprising:

a first shielding plane situated between a thermal pad and a first control IC chip and a second shielding plane situated between the thermal pad and a second control IC chip.

2. The apparatus of claim 1, wherein the first shielding plane and the second shielding plane overlay a substrate.

3. The apparatus of claim 2, further including a control module mounted on a first surface of the substrate.

4. The apparatus of claim 3, wherein the control module further includes an interconnect configured to provide a connection to a system bus.

5. The apparatus of claim 4, wherein the control module comprises a trace, and one of the first shielding plane and the second shielding plane underlies the trace.

6. The apparatus of claim 5, wherein the control module further comprises a wire bond coupled to the first control IC chip and coupled to the trace.

7. The apparatus of claim 3, wherein the control module further comprises a laminate substrate having a first surface and a second surface that opposes the first surface, wherein a patterned ground plane is situated on the first surface of the laminate substrate, and the first control IC chip and second control IC chip are mounted on the patterned ground plane.

8. The apparatus of claim 7, wherein the second surface of the laminate substrate overlies the first surface of the substrate.

9. The apparatus of claim 8, wherein the shielding planes are situated on the second surface of the laminate substrate.

10. The apparatus of claim 8, wherein the laminate substrate further comprises vias that couple the patterned ground plane to the shielding planes.

11. The apparatus of claim 1, wherein the first control IC chip controls a first switching level of the apparatus and the second control IC chip controls a second switching level of the apparatus.

12. The apparatus of claim 1, wherein the first control IC chip is coupled to a power transistor and the second control IC chip is coupled to another power transistor.

13. The apparatus of claim 1, wherein the apparatus is a power converter module.

14. The apparatus of claim 1, further comprising a patterned direct bonded copper (DBC) layer that is patterned to provide the first and second shielding planes.

15. The apparatus of claim 14, wherein an interconnect is mounted on the patterned DBC layer and the interconnect comprises pads for mounting the first and second control IC chips.

16. The apparatus of claim 15, wherein the interconnect comprises a trace, and one of the first shielding plane and the second shielding plane underlies the trace.

17. The apparatus of claim 1, wherein the first shielding plane and the second shielding plane block electromagnetic interference emanating through a heat sink.

18. The apparatus of claim 12, wherein the power transistors are gallium nitride (GaN) field effect transistors (FETs) or silicon carbide (SiC) FETs.

19. The apparatus of claim 2, wherein the substrate comprises a ceramic core.

20. The apparatus of claim 1, wherein the apparatus is a direct current (DC) to alternating current (AC) power converter module or a DC-to-DC power converter.

21. The apparatus of claim 1, wherein pins of the apparatus have a parasitic capacitance between about 0.02 picofarads (pF) and about 38 pF.

* * * * *